(12) United States Patent
Peng et al.

(10) Patent No.: US 10,508,027 B2
(45) Date of Patent: Dec. 17, 2019

(54) CMOS-MEMS STRUCTURE AND METHOD OF FORMING THE SAME

(71) Applicant: TAIWAN SEMICONDUCTOR MANUFACTURING COMPANY LTD., Hsinchu (TW)

(72) Inventors: Jung-Huei Peng, Hsinchu Hsien (TW); Chia-Hua Chu, Hsinchu County (TW); Fei-Lung Lai, New Taipei (TW); Shiang-Chi Lin, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/058,897

(22) Filed: Aug. 8, 2018

(65) Prior Publication Data

US 2018/0362335 A1    Dec. 20, 2018

Related U.S. Application Data

(62) Division of application No. 15/457,498, filed on Mar. 13, 2017, now Pat. No. 10,046,965, which is a
(Continued)

(51) Int. Cl.
*B81C 1/00* (2006.01)
*B81B 7/00* (2006.01)

(52) U.S. Cl.
CPC ........ *B81C 1/00238* (2013.01); *B81B 7/0038* (2013.01); *B81C 1/00285* (2013.01); *B81B 2201/0235* (2013.01); *B81B 2201/0242* (2013.01); *B81B 2203/0127* (2013.01); *B81B 2203/0315* (2013.01); *B81B 2203/04* (2013.01); *B81B 2207/012* (2013.01); *B81C 2201/019* (2013.01); *B81C 2201/0125* (2013.01);
(Continued)

(58) Field of Classification Search
CPC ............ B81C 1/00238; B81C 1/00285; B81C 2201/019; B81C 2201/0154; B81C 2201/0125; B81C 2203/0792; B81C 2203/035; B81C 2203/0118; B81C 1/00301; B81B 7/0038; B81B 2207/012; B81B 2203/04; B81B 2203/881; B81B 2203/0127; B81B 2201/0242; B81B 2201/0235; B81B 7/02; B81B 7/0006
See application file for complete search history.

(56) References Cited

U.S. PATENT DOCUMENTS

2012/0313235 A1* 12/2012 Chu ...................... B81B 3/0005
                                                                    257/692
2015/0137280 A1*  5/2015 Chu ...................... B81B 7/0038
                                                                    257/415
(Continued)

*Primary Examiner* — Yasser A Abdelaziez
(74) *Attorney, Agent, or Firm* — WPAT, P.C., Intellectual Property Attorneys; Anthony King

(57) ABSTRACT

The present disclosure provides a CMOS structure, including a substrate, a metallization layer over the substrate, a sensing structure over the metallization layer, and a signal transmitting structure adjacent to the sensing structure. The sensing structure includes an outgassing layer over the metallization layer, a patterned outgassing barrier over the outgassing layer; and an electrode over the patterned outgassing barrier. The signal transmitting structure electrically couples the electrode and the metallization layer.

15 Claims, 21 Drawing Sheets

Related U.S. Application Data division of application No. 14/883,908, filed on Oct. 15, 2015, now Pat. No. 9,630,831.

(52) U.S. Cl.
CPC .......... *B81C 2201/0154* (2013.01); *B81C 2203/0118* (2013.01); *B81C 2203/035* (2013.01); *B81C 2203/0792* (2013.01)

(56) References Cited

U.S. PATENT DOCUMENTS

| | | | | |
|---|---|---|---|---|
| 2015/0329351 A1* | 11/2015 | Cheng | .......... | B81C 1/00238 257/417 |
| 2015/0360939 A1* | 12/2015 | Zhang | .......... | B81C 1/00246 438/51 |
| 2016/0221819 A1* | 8/2016 | Smeys | .......... | B81B 7/0041 |
| 2017/0008757 A1* | 1/2017 | Cheng | .......... | B81B 3/001 |

* cited by examiner

CMOS-MEMS STRUCTURE AND METHOD OF FORMING THE SAME

CROSS REFERENCE TO RELATED APPLICATIONS

This application claims the benefit of prior-filed application Ser. No. 14/883,908, filed Oct. 15, 2015, and prior-filed application Ser. No. 15/457,498, filed Mar. 13, 2017, under 35 U.S.C. 120.

BACKGROUND

Micro electromechanical systems (MEMS) sensors are used for various applications including gyroscopes, accelerometers or other sensing applications. A vacuum region is maintained around the MEMS sensor. Signals generated using the MEMS sensors are transmitted to a complementary metal oxide semiconductor (CMOS) package through an interconnect structure.

The CMOS package is electrically connected to the MEMS sensors using a eutectic bond interface between a bond pad on the CMOS package and a bond pad on the MEMS sensor. The interconnect structure is in contact with the vacuum region around the MEMS sensors

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
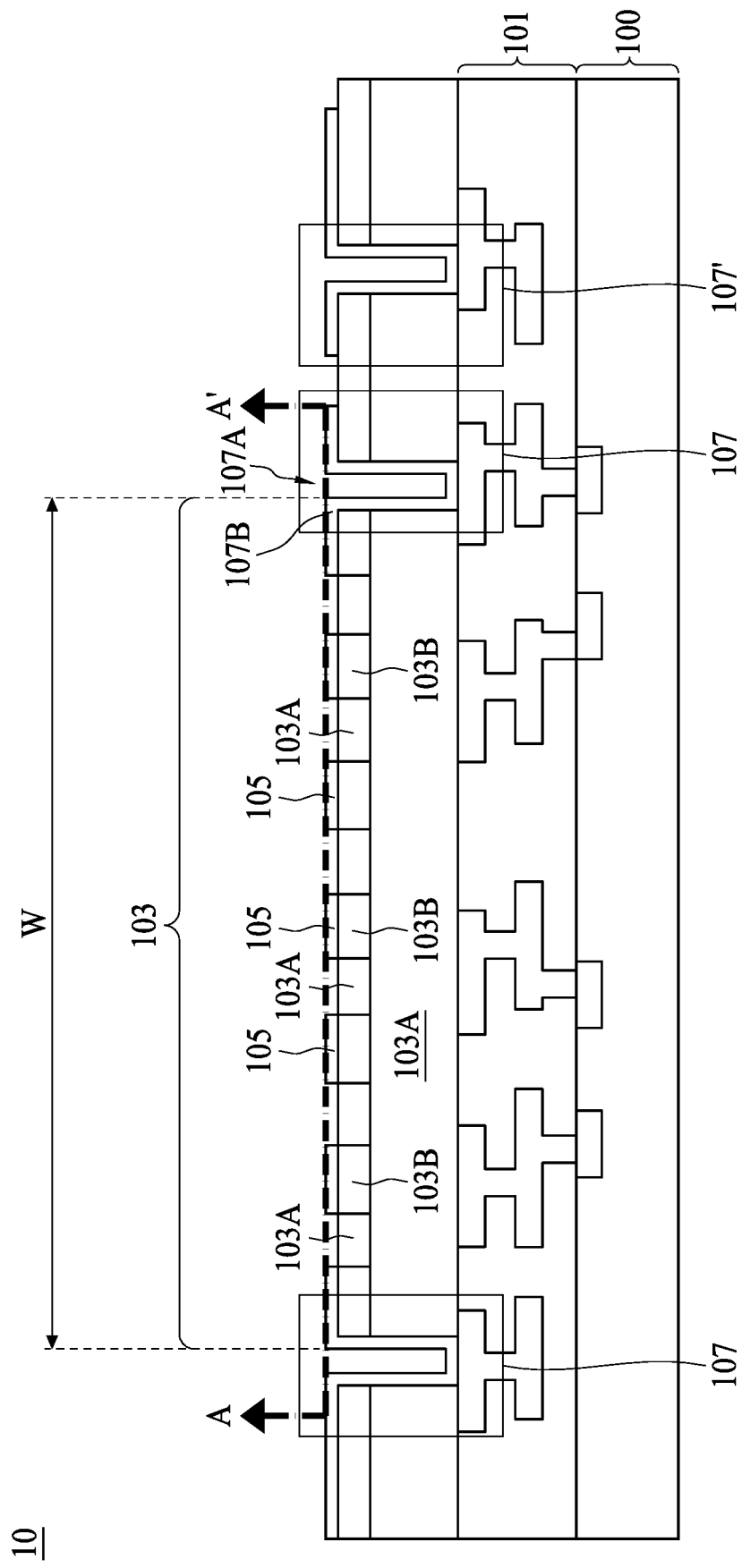
FIG. 1 is a cross section of a CMOS structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present invention relates generally to Micro-Electro-Mechanical Systems (MEMS) devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In the described embodiments, MEMS refers to a class of structures or devices fabricated using semiconductor-like processes and exhibiting mechanical characteristics such as the ability to move or deform. MEMS often, but not always, interact with electrical signals. MEMS devices include, but are not limited to, gyroscopes, accelerometers, magnetometers, pressure sensors, and radio-frequency components. In some embodiments, a MEMs device structure may include a plurality of the aforesaid MEMs devices. Silicon wafers containing a MEMS device or a MEMS device structure are referred to as MEMS wafers.

In the described embodiments, MEMS device may refer to a semiconductor device implemented as a micro-electromechanical system. A MEMS device structure may refer to any feature associated with an assembly of a plurality of MEMS devices. An engineered silicon-on-insulator (ESOI) wafer may refer to a SOI wafer with cavities beneath the silicon device layer or substrate. Cap or handle wafer typically refers to a thicker substrate used as a carrier for the thinner silicon sensing substrate in a silicon-on-insulator wafer. Cap or handle substrate and cap or handle wafer can be interchanged.

MEMS devices require different pressures in the enclosures defined by the CMOS wafer and the MEMS wafer. For example, an accelerometer in MEMS requires an enclosure with greater pressure while a gyroscope requires an enclosure with lower pressure. The vacuum in the enclosures is used to facilitate free movement of MEMS section of the MEMS device with minimal resistance. In some embodiments, a pressure in the enclosures of a gyroscope is less than or equal to 0.001 millibar (mbar). If the pressure is too high, MEMS sensing workpiece will experience higher resistance to movement, in some embodiments. Resistance to movement of MEMS sensing workpiece reduces a speed of movement of the MEMS sensing workpiece which delays generation and transfer of signals induced by the movement of the MEMS sensing workpiece. The higher resistance to movement will also decrease precision of the signals generated by the movement of MEMS sensing workpiece. The decreased precision in turn increases a complexity of calculations used to determine the information being generated by MEMS sensing workpiece. As the complexity of a circuit increases, a number of devices in the circuit and a size of the circuit also increase. However, on the other hand, the vacuum in an accelerometer shall be greater than that of the gyroscope. Although low pressure facilitates the movement of MEMS sensing workpiece, an accelerometer requires a greater pressure to assist damping of the MEMS sensing workpiece, in order to prevent the MEMS sensing workpiece from natural agitation which contributes to high noise.

Nowadays integrating an accelerometer and a gyroscope on a same MEMS device generates problems of how to create two enclosures possessing different vacuum pressures. Forming an outgassing layer in one enclosure could increase the vacuum pressure whereas barring the outgassing layer from another enclosure could preserve the low vacuum pressure. Outgassing is a result of dangling bonds formed during formation of the conductive lines and vias in an interconnect structure of the CMOS wafer. During subsequent processing steps, heating causes the dangling bonds to break which releases gas from the interconnect structure. This process is known as outgassing. Pressure is directly proportional to a number of gas molecules in a space. In approaches which do not include an outgassing barrier between the interconnect structure and enclosure, as the number of gas molecules in enclosure rises, the pressure also rises.

Generally an outgassing layer can be made of oxide materials without any outgassing barrier covered thereupon. The outgassing layer can be formed on a CMOS wafer facing the enclosure between the MEMS sensing workpiece. For example, a high compactness material which prevents gaseous molecules from out-diffusion, for example, nitrides, can be used as an outgassing barrier. Conventionally an outgassing layer shall be made wide open without any obstruction to the enclosure in order to maximize the outgassing pressure. Sensing electrodes deposited over the outgassing layer inevitably act as an outgassing barrier which inhibits the gas molecules from escaping from the outgassing layer into the enclosures. A tradeoff between an area of the exposed outgassing layer and an area of the sensing electrode shall be designed in order to obtain optimal performance of the MEMS device that requires greater vacuum pressure.

Nevertheless, an operation of forming the outgassing layer includes patterning an outgassing barrier to expose a region of the underlying first outgassing layer. For example, a width of the removed outgassing barrier viewing from a cross section is equal to or greater than 50 µm. The exposed region is then filled with a second outgassing layer and followed by a planarization operation until the second outgassing layer and the outgassing barrier are coplanar. The planarization operation includes, but not limited to, a chemical mechanical polishing (CMP) operation. The planarization operation is designed to reduce the thickness of the overfilled second outgassing layer and hence does not consume the outgassing barrier.

In addition, the second outgassing layer at a center portion of the exposed region is found to have a greater removing rate than that at a peripheral portion of the exposed region where the second outgassing layer and the outgassing barrier are adjoined. A dishing effect can be observed after the planarization operation and this structural defect may cause the subsequently-deposited sensing electrode not disposing on a flat surface. For example, if the sensing electrode has a mesh pattern, a top surface of the mesh pattern is not coplanar. Even the geometrical shape of the mesh pattern may be altered due to the non-flat surface of the second outgassing layer. The top surface of the mesh pattern would conform to the dishing surface of the underlying second outgassing layer and thus generating an unequal distance between each point of the sensing electrode and the sensing workpiece of the MEMS substrate. Unequal distances between sensing electrode and the sensing workpiece deteriorate the sensitivity of the sensing signal because such unequal distance would interfere the capacitance signal derived from the distance between the sensing electrode and the sensing workpiece.

The present disclosure provides a CMOS structure and a method for manufacturing the same. The CMOS structure corresponds to a MEMS structure including an accelerometer. The CMOS structure has a sensing electrode over an outgassing layer, the sensing electrode having a coplanar surface.

The present disclosure provides a CMOS-MEMS structure and a method for manufacturing the same. The CMOS-MEMS structure includes at least a higher vacuum pressure enclosure and a lower vacuum pressure enclosure integrated together. The CMOS-MEMS structure has a sensing electrode over an outgassing layer in the higher vacuum pressure enclosure, and the sensing electrode having a coplanar surface.

Referring to FIG. 1, FIG. 1 is a cross section of a CMOS structure 10, in accordance with some embodiments of the present disclosure. The CMOS structure 10 includes a semiconductor substrate 100. The substrate 100 may include a semiconductor material such as silicon, although other semiconductor materials may be used. A plurality of CMOS devices (such as transistors) is formed in proximity to a surface of substrate 100. CMOS devices is one of the active circuitry configured to perform calculations or execute procedures based on signals received from MEMS sensing workpiece (not shown in FIG. 1) through electrical connections. In some embodiments, active circuitry may further include bi-polar transistor (BJT) devices, Fin field effect transistor (FinFET) devices, or other suitable active devices. The substrate 100 can be referred to a circuit substrate.

A metallization layer 101 is positioned over the substrate 100, electrically couple to the substrate 100. The metallization layer 101 may include dielectric layers, which further include low-k dielectric layers, ultra low-k layers, non-low-k dielectric layers such as passivation layers, and the like. Low k materials have a dielectric constant less than a dielectric constant of silicon oxide. In some embodiments, low k materials have a dielectric constant less than about 3.9. In some embodiments, low k materials include fluorine-doped silicon oxide, carbon-doped silicon oxide, porous silicon oxide, polymer materials, or other suitable low k materials. In some embodiments, ultra-low k materials have a dielectric constant less than or equal to about 2.5. In some embodiments, ultra-low k materials include xerogel, polymers, or other suitable ultra-low k materials. The metallization layer 101 further includes metal lines and vias, which may be formed of copper, aluminum, conductive polymers, or other suitable conductive elements, are formed in the dielectric layers. The metallization layer 101 is configured to convey signals to and from circuit substrate 100.

Referring to FIG. 1, a sensing structure 103 is positioned over the metallization layer 101. The sensing structure 103 is so named because it is disposed corresponding to a sensing workpiece of a MEMS device (not shown in FIG. 1). Alternatively stated, the sensing structure 103 is a component of the circuit substrate 100 and is designed to be aligned to the sensing workpiece of a MEMs device subsequently disposed thereon. In some embodiments, a width W of the sensing structure 103 is equal to or greater than 50 micrometer. The sensing structure 103 includes an outgassing layer 103A and a patterned outgassing barrier 103B in proximity to a top surface of the outgassing layer 103A. In some embodiments, the top surface of the outgassing layer 103A and a top surface of the outgassing barrier 103B are coplanar. Outgassing barrier 103B is placed between a portion of the outgassing layer 103A and a vacuum region later shown in FIG. 2. Separating a portion of the outgassing layer 103A from vacuum region helps to prevent outgassing from outgassing layer 103A into vacuum region which increases the pressure in the vacuum region. In some embodiments, outgassing barrier 103B includes a same material as substrate 100. In some embodiments, outgassing barrier 103B includes a different material from the outgassing layer 103A. For example, the outgassing layer 103A may include oxides deposited by various methods. The outgassing barrier 103B may include materials having high lattice compactness such as nitrides, in order to prevent outgassing gas molecules from out-diffusion. In some embodiments, the outgassing layer 103A can be silicon oxides such as Tetraethyl orthosilicate (TEOS), and the outgassing barrier 103B can be nitrides or oxynitrides. In some embodiments, the outgassing barrier 103B includes column IV-nitrides or column IV-oxynitrides.

In FIG. 1, a sensing electrode 105 is positioned on the patterned outgassing barrier 103B. Note the sensing electrode 105 can be referred to as an electrode discussed herein. In some embodiments, the sensing electrode 105 may possess a pattern identical to the outgassing barrier 103B. However, in other embodiments, the sensing electrode 105 may not require a pattern identical to the outgassing barrier 103B. For example, the sensing electrode 105 may be only disposed on a portion of the outgassing barrier 103B.

However, the sensing electrode 105 may not be disposed directly on the outgassing layer 103A. A signal transmitting structure 107 is laterally adjacent to the sensing structure 103. As shown in FIG. 1, some the signal transmitting structure 107 is electrically coupling the sensing electrode 105 and the conductive lines/vias in the metallization layer 101. However, some the signal transmitting structure 107' is configured to electrically coupling the MEMS substrate later shown in FIG. 2 and the conductive lines/vias in the metallization layer 101. In some embodiments, the signal transmitting structures 107, 107' are surrounding the sensing structure 103 and being arranged along a circumference of the sensing structure 103 from a top view perspective. In some embodiments, the signal transmitting structure 107 include a trench 107A penetrating through the outgassing barrier 103B and the outgassing layer 103A, exposing a portion of the top metal in the metallization layer 101. In some embodiments, the top metal can be a sixth metal layer of the metallization layer 101 and can be composed of Al. A conductive liner 107B is disposed over a sidewall and a bottom of the trench 107A so as to transmit the signals generated in the sensing electrode 105 to the underlying CMOS substrate 100 through the metallization layer 101.

A variety of pattern can be adopted by the outgassing barrier 103B and the sensing electrode 105. However, as long as the pattern is evenly distributed (i.e., not being concentrated located in a specified region) in the sensing structure 103, the pattern can be adopted in the CMOS structure 10 and the CMOS-MEMS structures 20, 30 described herein. In some embodiments, a mesh pattern can be adopted by the outgassing barrier 103B and the sensing electrode 105.

Figure 2:
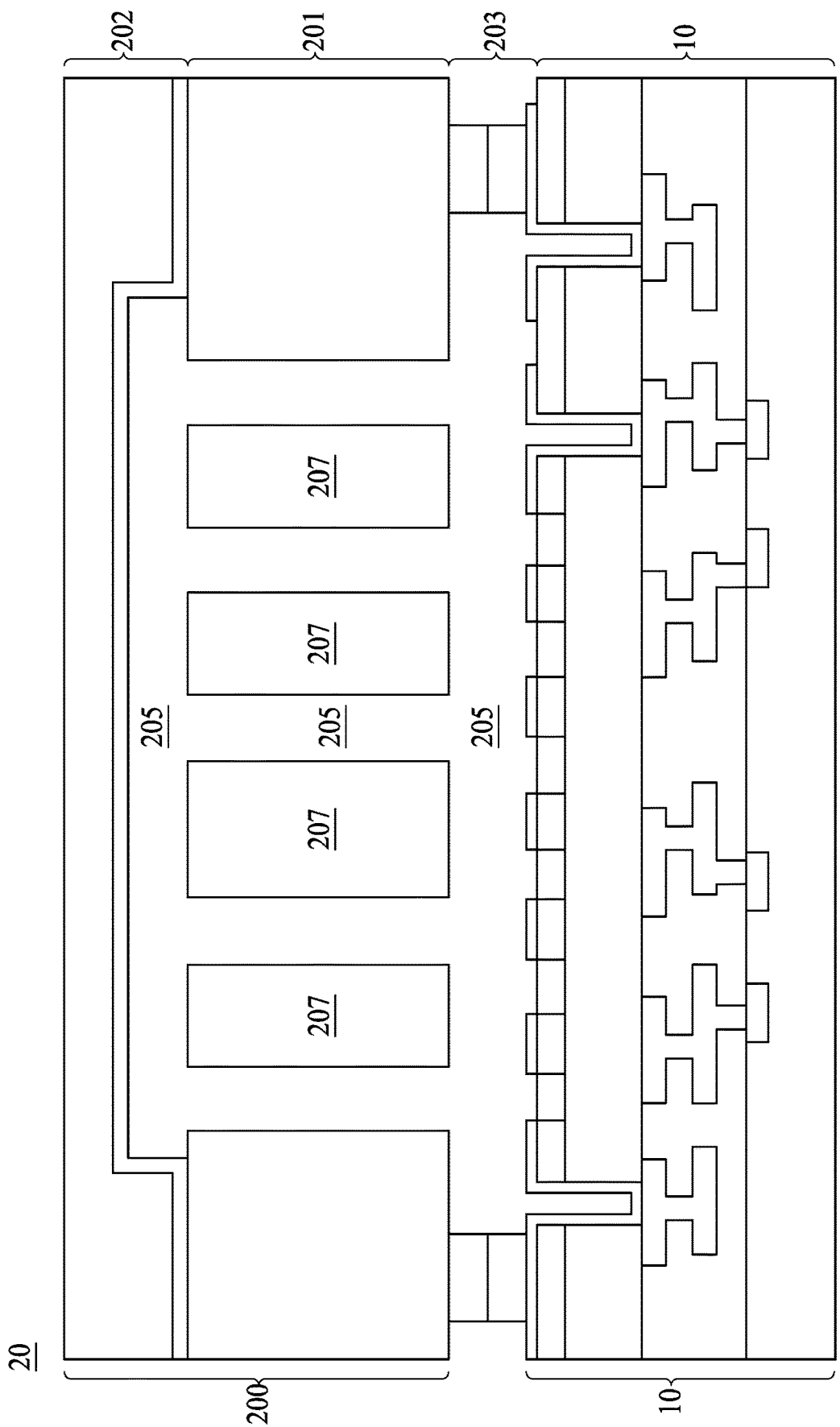
FIG. 2 is a cross section of a CMOS-MEMS structure, in accordance with some embodiments of the present disclosure.

Referring to FIG. 2, FIG. 2 is a cross section of a CMOS-MEMS structure 20, in accordance with some embodiments of the present disclosure. The CMOS-MEMS structure 20 of FIG. 2 includes a CMOS structure 10 as shown in FIG. 1 and a MEMS structure 200 over the CMOS structure 10. The MEMS structure 200 further possesses a MEMS substrate 201 and a cap substrate 202. The MEMS substrate 201 is connected to the CMOS structure 10 through, for example, eutectic bond 203. An enclosure defined by a bottom of the MEMs substrate 201, a top of the CMOS structure 10, and the eutectic bond 203 can be referred to a vacuum region 205. The vacuum region 205 is around sensing workpiece 207. A vacuum is maintained in the vacuum region 205 in order to help facilitate movement of the sensing workpiece 207 relative to MEMS substrate 201. A region between MEMS substrate 201 and CMOS substrate 10 defines a bonding location of the MEMS structure 200 to the CMOS structure 10. MEMS structure 200 further includes a cap substrate 202 bonded to MEMS substrate 201 on an opposite side from CMOS structure 10. Cap substrate 202 also helps define a location of vacuum region 205 around sensing workpiece 207. Cap substrate 202 helps to prevent an increase in pressure in vacuum region 205 from an external environment. Cap substrate 202 is fusion bonded to MEMS substrate 201 to provide a seal around sensing workpiece 207. In some embodiments, a metal layer is formed on a bottom surface of cap substrate 202 and a top surface of CMOS structure 10 and the cap substrate 202 is eutectically bonded to CMOS structure 10. In some embodiments, cap substrate 202 includes a same material as at least one of MEMS substrate 201 or CMOS structure 10. In some embodiments, cap substrate 202 includes a different material from both MEMS substrate 201 and CMOS structure 10.

In some embodiments, MEMS substrate 201 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, MEMS substrate 201 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, MEMS structure 200 includes a sensing workpiece 207 which is configured to rotate or translate within the vacuum region. Movement of sensing workpiece 207 within vacuum region 205 creates varying electrical signals which are transferred to the active devices in CMOS structure 10. In some embodiments, sensing workpiece 207 include a gyroscope, an accelerometer, a pressure sensor, or another suitable sensing workpiece 207. In some embodiments, sensing workpiece 207 include magnetic elements which are configured to induce electrical signals due to the movement of the MEMS section. In some embodiments, sensing workpiece 207 are configured to rotate about one or more axis. In some embodiments, sensing workpiece 207 are configured to translate in a plane parallel to a top surface of CMOS structure 10.

In some embodiments, cap substrate 202 is eutectically bonded to MEMS substrate 201. In embodiments where cap substrate 202 is eutectically bonded to MEMS substrate 201. In some embodiments, the eutectic bonding operation is performed at a temperature ranging from about 430 degrees Celsius to about 460 degrees Celsius. In some embodiments, cap substrate 202 is pressed against MEMS substrate 201 at a pressure ranging from about 30 kN to about 60 kN. In some embodiments, the eutectic bonding operation is performed in an environment including argon, nitrogen gas, hydrogen gas, or other suitable gases.

In some embodiments, a MEMS substrate 201 and a cap substrate 202 are fusion bonded together with a thin dielectric film therebetween. Please note that in the exemplary embodiment of the present disclosure, the MEMS substrate 201 and the cap substrate 202 are bonded together by fusion bonding at relatively high processing temperatures, which enables more complete removal of chemical species from the dielectric materials in the substrates prior to sealing cavities of the MEMS structures. Fusion bonding makes high temperature annealing on both sides wafers possible, which reduces outgassing of chemical species during the cavity formation process. The MEMS structures bonded by fusion bonding are mechanically stronger compared to metal bonding due to a higher bonding ratio. In addition, fusion bonding enables the formation of through substrate vias (TSVs) in the MEMS structures without degrading yield. However, the concept of the present disclosure is not limited thereto. One of ordinary skill in the art would recognize many variations, modifications, and alternatives. Along with a surface of the cap substrate 202, a plurality of enclosures of desired sizes can be defined and patterned on through isotropic etching, for example, but this is not a limitation of the present disclosure. One of ordinary skill in the art would recognize many variations, modifications, and alternatives. The plurality of enclosures are utilized to accommodate adjacent sensing workpiece 207. The size of each enclosure may be determined according to the sensing workpiece 207 and/or desired performance of the MEMS device. In some embodiments, each enclosure may be of different dimensions than the other enclosures.

Figure 3:
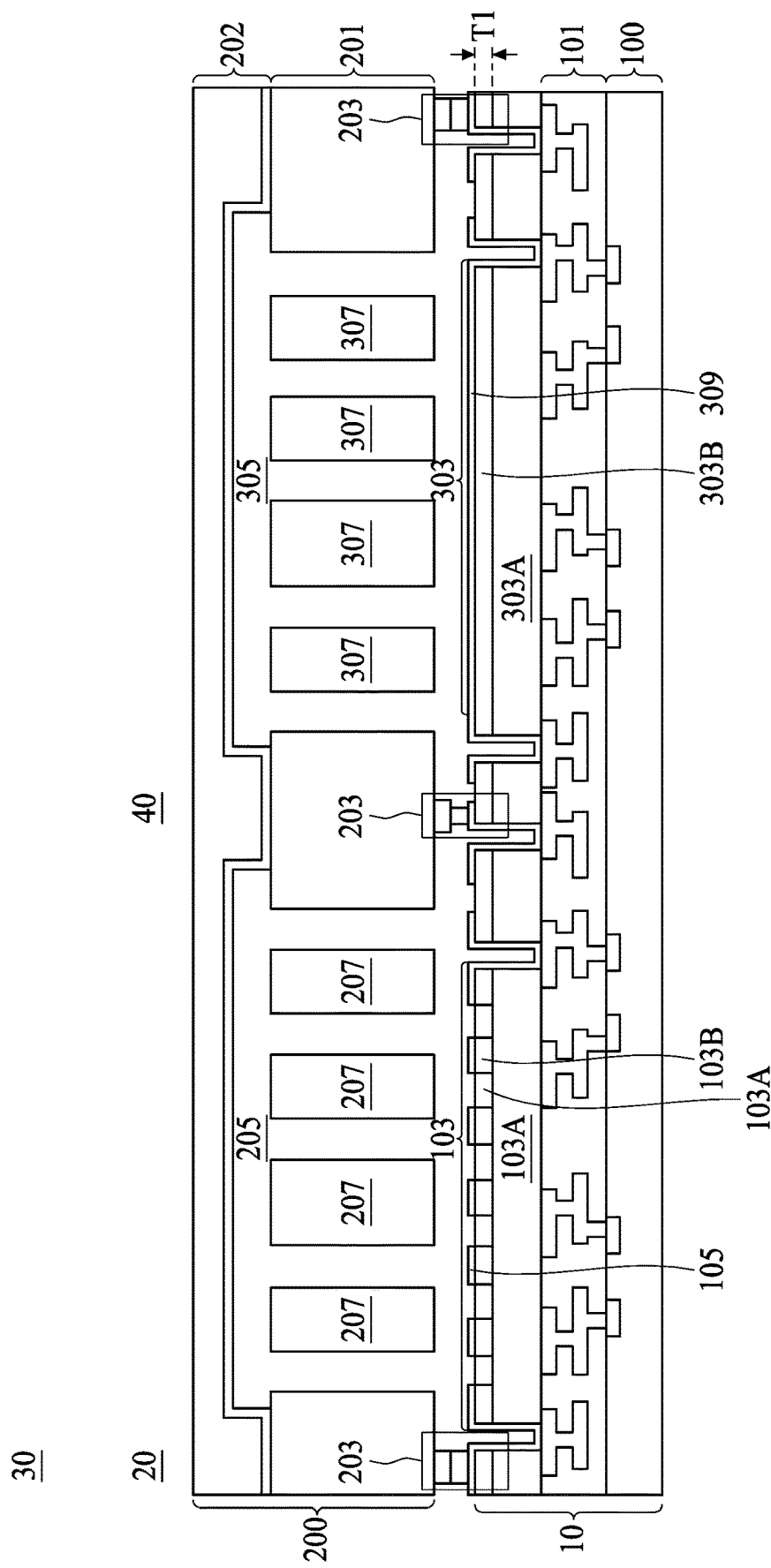
FIG. 3 is a cross section of a CMOS-MEMS structure, in accordance with some embodiments of the present disclosure.

Referring to FIG. 3, FIG. 3 is a cross section of a CMOS-MEMS structure 30, in accordance with some embodiments of the present disclosure. The CMOS-MEMS structure 30 is integrated with a CMOS-MEMS structure 20 as shown in FIG. 1 and a CMOS-MEMS structure 40. In some embodiments, the CMOS-MEMS structure 20 possesses a vacuum region 205 with greater vacuum pressure and the CMOS-MEMS structure 40 possesses a vacuum region 305 with a vacuum region 305 with lower vacuum pressure. Note the CMOS-MEMS structure 40 includes a sensing workpiece 307 and a sensing structure 303 over the CMOS substrate 100. The sensing structure 303 is correspondingly positioned under the sensing workpiece 307 of the CMOS-MEMS structure 40 so as to generate sensing signals according to the movement of the sensing workpiece 307. An outgassing layer 303A is over the metallization layer 101, and the outgassing layer 303A of the CMOS-MEMS structure 40 is completely covered by the outgassing barrier 303B. Furthermore, a sensing electrode 309 is disposed over the outgassing barrier 303B. In some embodiments, the outgassing layer 303A is not covered by the outgassing barrier 303B and is covered only by the sensing electrode 309 instead. Either of the embodiments (i.e., with or without outgassing barrier 303B), a distance between the bottom surface of the sensing workpiece 307 and the top surface of the sensing electrode 309 is uniform. Alternatively stated, the sensing electrode 309 of the CMOS-MEMS structure 40 is similar to the sensing electrode 105 of the CMOS-MEMS structure 20 in that the sensing electrode itself is coplanar across the sensing structure 103, 303, respectively.

In FIG. 3, the CMOS-MEMS structure 20 having a greater vacuum pressure in the vacuum region 205 can include an accelerometer. The CMOS-MEMS structure 40 having a lower vacuum pressure in the vacuum region 305 can include a gyroscope. In some embodiments, a thickness T1 of the outgassing barrier 103B of the CMOS-MEMS structure 20 is about 3.5 kÅ. In some embodiments, both the outgassing barrier 103B, 303B of the CMOS-MEMS structure 20 and the CMOS-MEMS structure 40 are about the same thickness. In the CMOS-MEMS structures 20 and 40, the sensing workpiece 207, 307 and the corresponding CMOS sensing structures 103, 303 are electrically connected through an eutectic bond 203. In some embodiments, the eutectic bond 203 is disposed outside of the sensing structure 103 or 303 are previously discussed.

Figure 4:
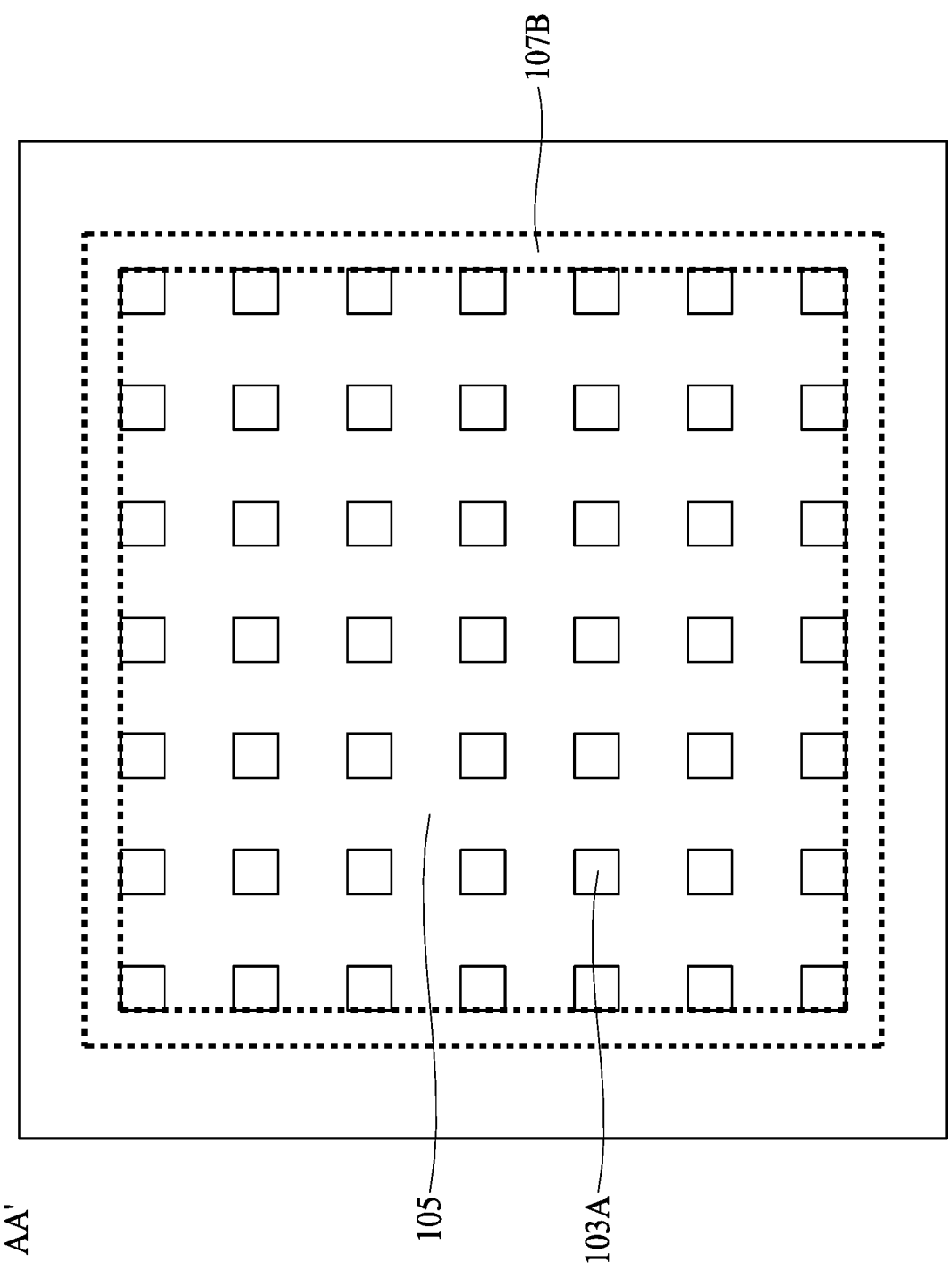
FIG. 4 is a top view of a sensing electrode of a CMOS structure, in accordance with some embodiments of the present disclosure.
Figure 5:
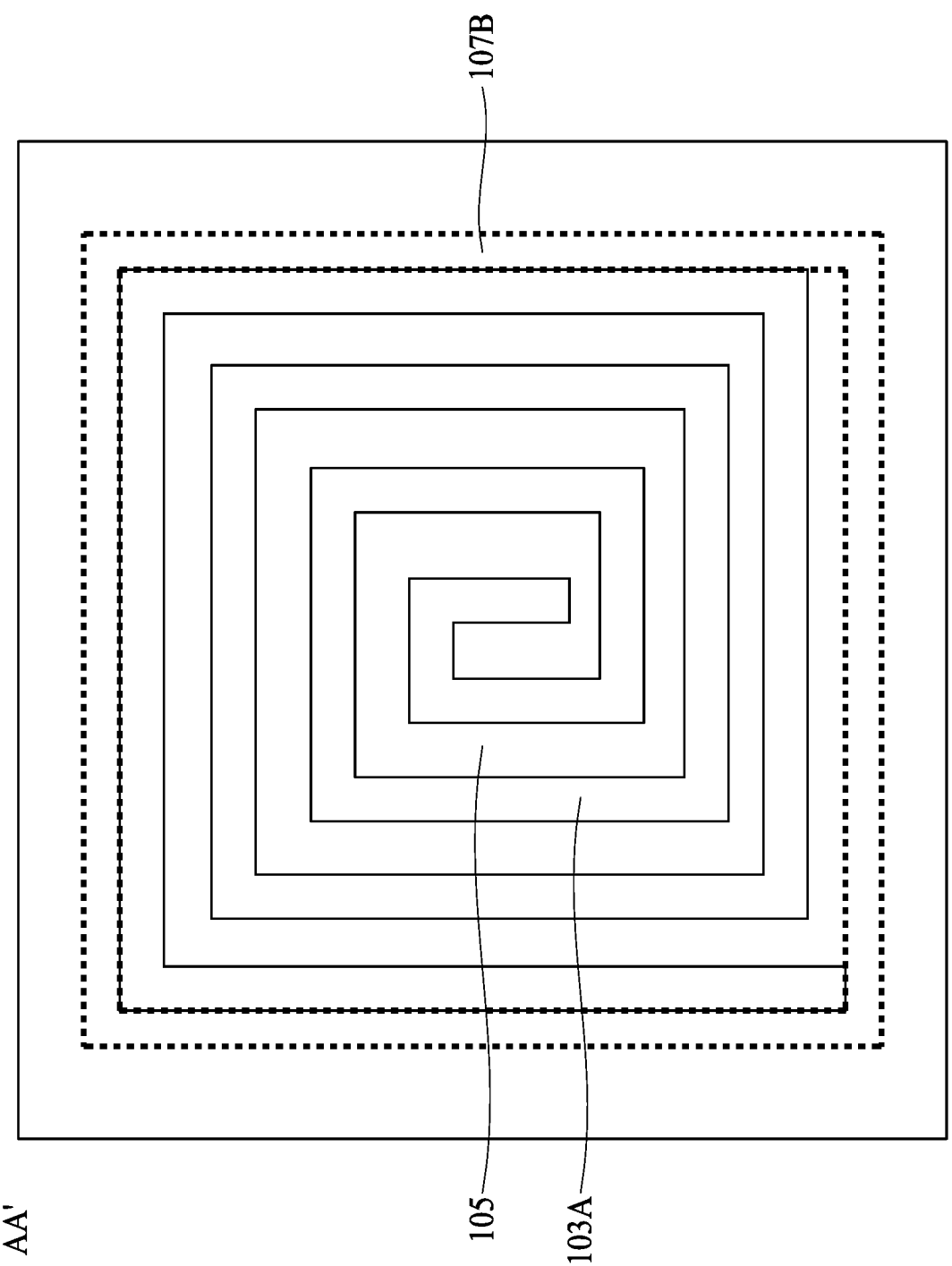
FIG. 5 is a top view of a sensing electrode of a CMOS structure, in accordance with some embodiments of the present disclosure.

Referring to FIG. 4 and FIG. 5, both figures show a top view of a sensing electrode 105 of a CMOS structure 10, in accordance with some embodiments of the present disclosure. FIG. 4 and FIG. 5 can be referred to a top view of a plane AA' shown in FIG. 1. The plane AA' extends from a signal transmitting structure 107 on a left end of the sensing structure 103 to another signal transmitting structure 107 on a right end of the sensing structure 103. In FIG. 4, a mesh sensing electrode 105 is positioned over an outgassing layer 103A, the outgassing layer 103A is then being surrounded by the signal transmitting structure 107 having, for example, a trench form deposited by a conductive liner 107B. The region delineated by the dotted lines refers to a bottom surface of the trench covered by the conductive liner 107B. In some embodiments, the material of the conductive liner 107B is identical to that of the sensing electrode 105. In FIG. 5, a spiral sensing electrode 105 is positioned over an outgassing layer 103A, the outgassing layer 103A is then being surrounded by the signal transmitting structure 107 having, for example, a trench form deposited by a conductive liner 107B. The region delineated by the dotted lines refers to a bottom surface of the trench covered by the conductive liner 107B. In some embodiments, the material of the conductive liner 107B is identical to that of the sensing electrode 105. Note the sensing electrode 105 shown in FIG. 4 and FIG. 5 are both evenly distributed in the sensing structure 103 of the CMOS structure.

Figure 6:
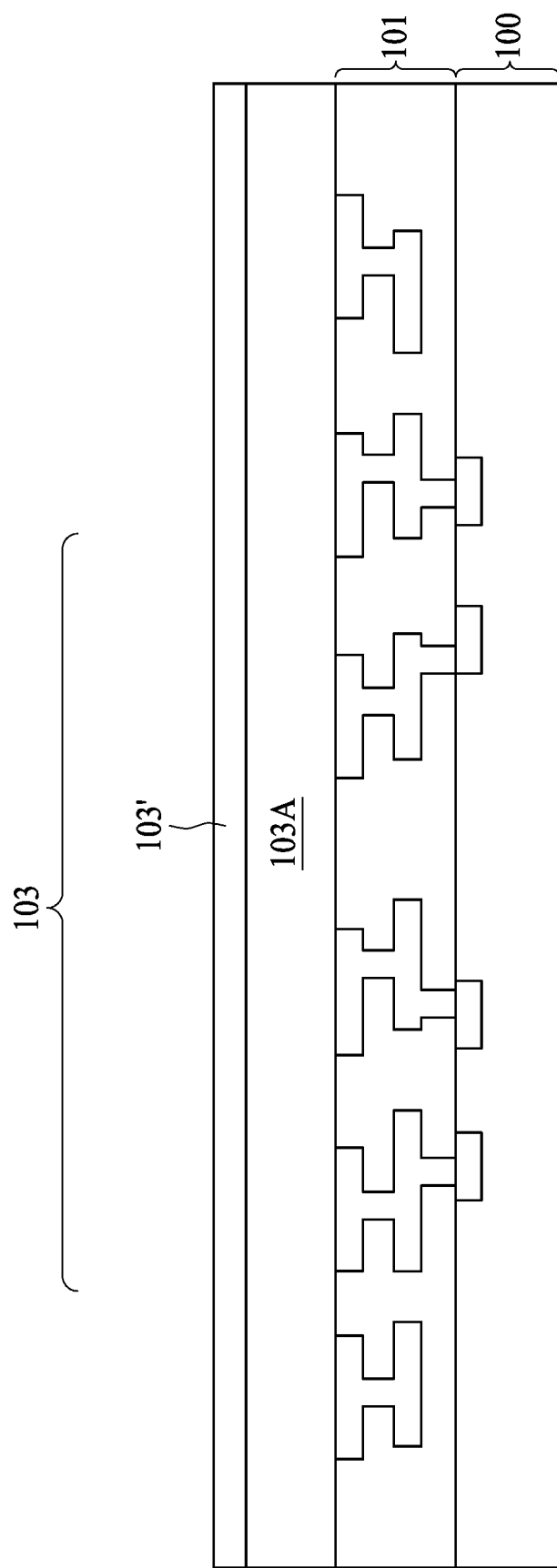
FIG. 6 to FIG. 14 are fragmentary cross sections of operations for a CMOS-MEMS structure, in accordance with some embodiments of the present disclosure.

FIG. 6 to FIG. 14 are fragmentary cross sections of operations for a CMOS-MEMS structure 20, in accordance with some embodiments of the present disclosure. In FIG. 6, a substrate 100 is provided. A metallization layer 101 as previously discussed is formed over the substrate 100. A first outgassing layer 103A is deposited over a top surface of the metallization layer 101. In some embodiments, the first outgassing layer 103A is an oxide layer and is formed by the assistance of high density plasma. An outgassing barrier 103' is then blanket deposited over the first outgassing layer 103A. In some embodiments, the outgassing barrier 103' can be materials having high lattice compactness which could effectively prevent the outgassing gas molecules from out-diffusion. In some embodiments, the outgassing barrier 103' is silicon nitride.

Figure 7:
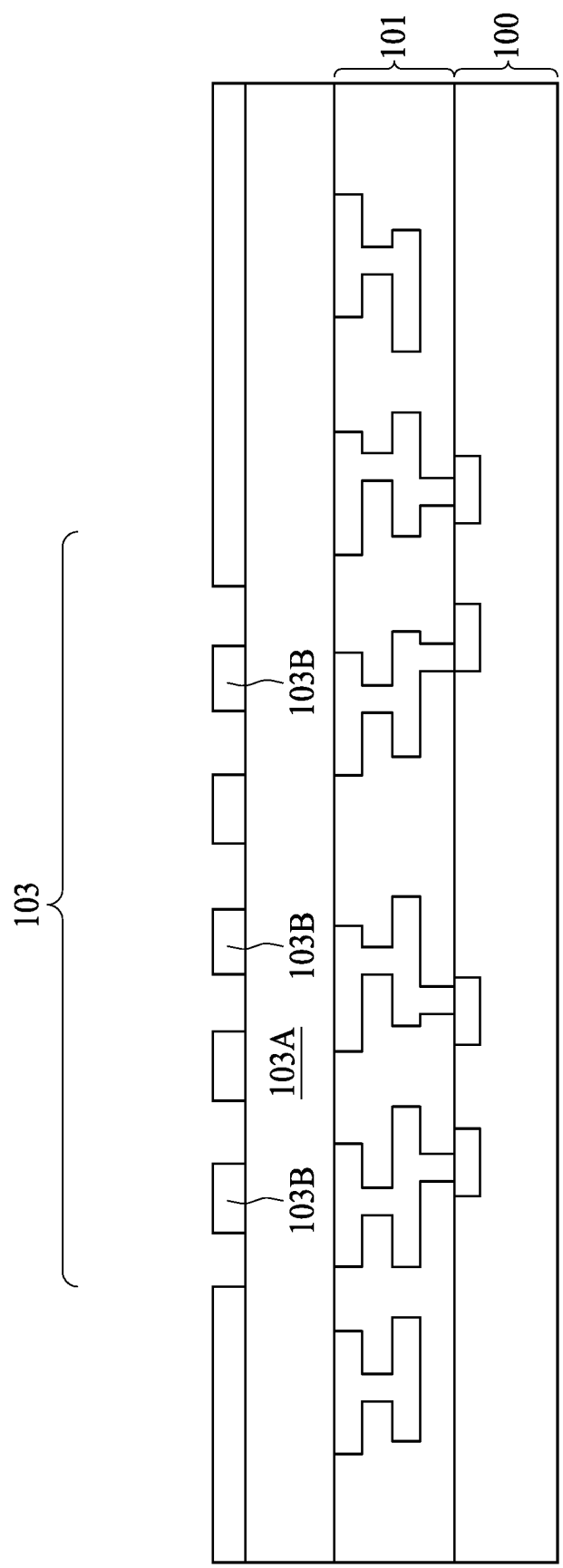
Figure 8:
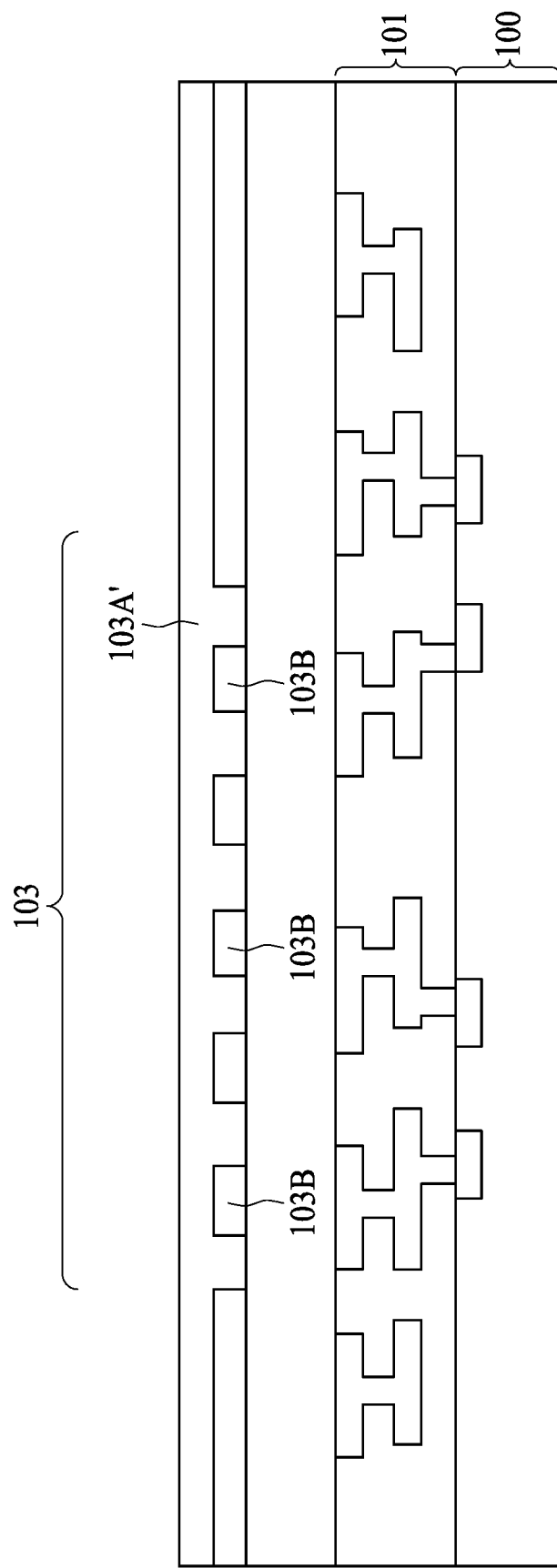
Figure 9:
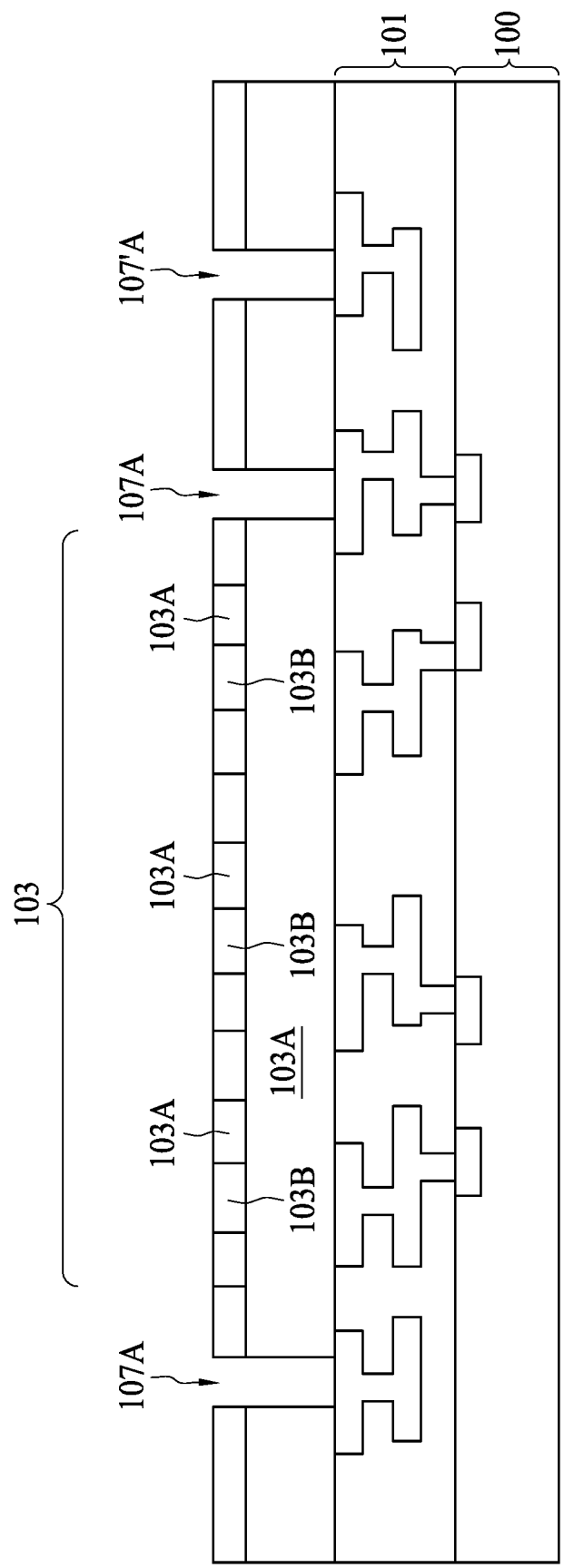

In FIG. 7, the outgassing barrier 103' is partially etched by a lithography operation in order to form a patterned outgassing barrier 103B in a sensing structure 103 of the CMOS structure. Note the lithography operation used to pattern the outgassing barrier 103B includes a first mask, for example, having a mesh pattern. In FIG. 8, a second outgassing layer 103A' is blanket deposited over the patterned outgassing barrier 103B, not only covering the outgassing barrier 103B inside the sensing structure 103 but also extending to the outgassing barrier 103B outside the sensing structure 103. In other words, the second outgassing layer 103A' is formed to fill the space between the outgassing barrier 103B and being disposed over the first outgassing layer 103A, as well as to cover the outgassing barrier 103B. In some embodiments, the first outgassing layer 103A and the second outgassing layer 103A' are formed of identical material assisted by high density plasma. In other embodiments, the second outgassing layer 103A' are formed of different materials than the first outgassing layer 103A but the lattice compactness of the second outgassing layer 103A' is lower than that of the first outgassing layer 103A. Referring to FIG. 9, a planarizing operation is conducted to remove a portion of the second outgassing layer 103A' until a top surface of the outgassing barrier 103B is exposed. In some embodiments, the planarizing operation includes chemical mechanical polishing. Note in some embodiments, a width W of the sensing structure 103 in the CMOS is equal to or greater than 50 µm.

Figure 10:
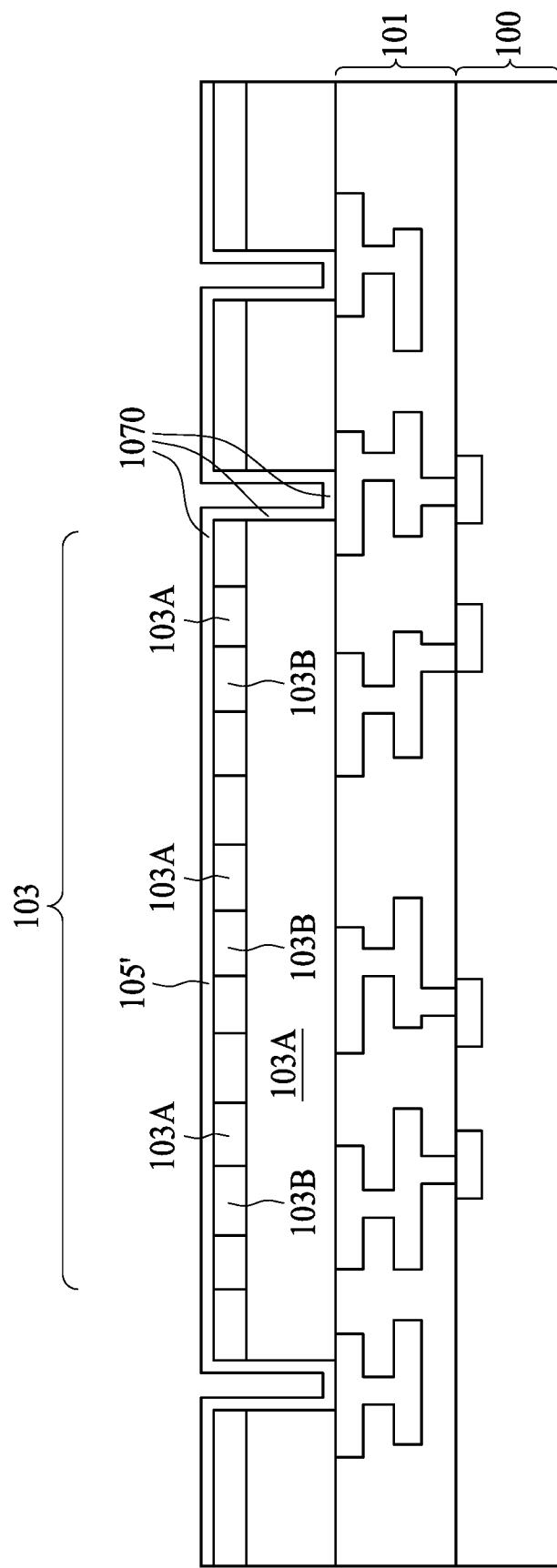

Furthermore, trenches 107A, 107'A are formed outside of the sensing structure 103 by a suitable dry etching operation. The trenches 107A, 107'A are formed by removing a portion of the outgassing barrier 103B and the first outgassing layer 103A, and by exposing a portion of the top metal of the metallization layer 101. Note at least two types of trenches can be formed in the current operation. The trench 107A is formed closely surrounding the sensing structure 103. The trench 107'A is formed to surround the trench 107A. Although at the current operation the trenches 107A, 107'A are of the same structure, electrical connection of the trenches 107A, 107'A are different as would be discussed later in FIG. 14. In FIG. 10, a conductive layer 105', 107' is deposited over the outgassing barrier 103B and the planarized second outgassing layer 103A. The portion of the conductive layer in the sensing structure 103 can be referred to as conductive layer 105', and the portion of the conductive layer in the trench 107A, 107'A can be referred to as conductive layer 107'.

Figure 11:
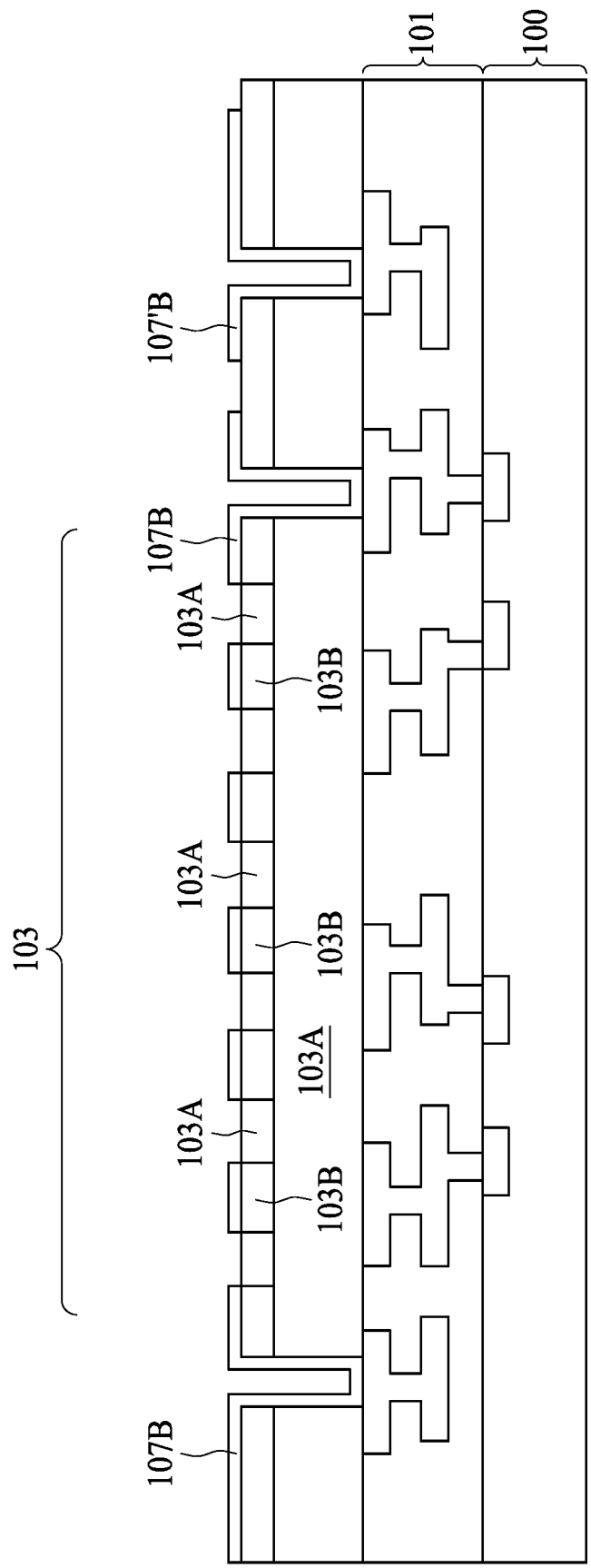
Figure 12:
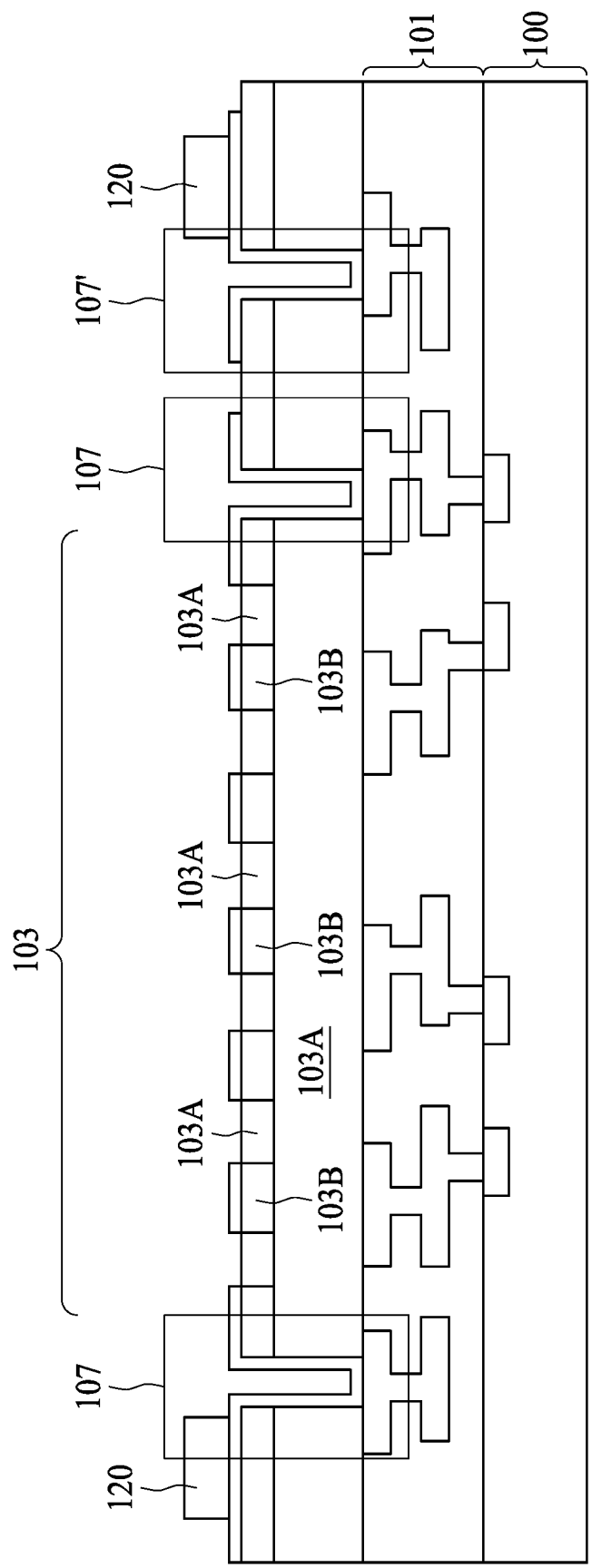

In FIG. 11, the conductive layer 105', 1070 is patterned by a lithography operation to form a sensing electrode 105 inside the sensing structure 103 and conductive liner 107B, 107'B outside the sensing structure 103. In some embodiments, the conductive layer 105', 1070 is TiN. Note the lithography operation includes using a second mask to remove a portion of the conductive layer 105', 1070. In some embodiments, the second mask possesses a pattern identical to the pattern of the first mask inside the sensing structure 103. Alternatively stated, the sensing electrode 105 has a pattern identical to the underlying outgassing barrier 103B. In some other embodiments, the second mask possesses a pattern not identical to the pattern of the first mask inside the sensing structure 103. For example, not all the outgassing barrier 103B being covered by the sensing electrode 105. Some stripes of the outgassing barrier 103B may be exposed directly to the vacuumed region of the CMOS-MEMS structure. In FIG. 12, a first metal layer 120 is formed outside of the signal transmitting region 107, 107' over the conductive liner 107B, 107'B. In some embodiments, the first metal layer 120 is able to form an eutectic bond with Ge. In some embodiments, the first metal layer 120 includes Al.

Figure 13:
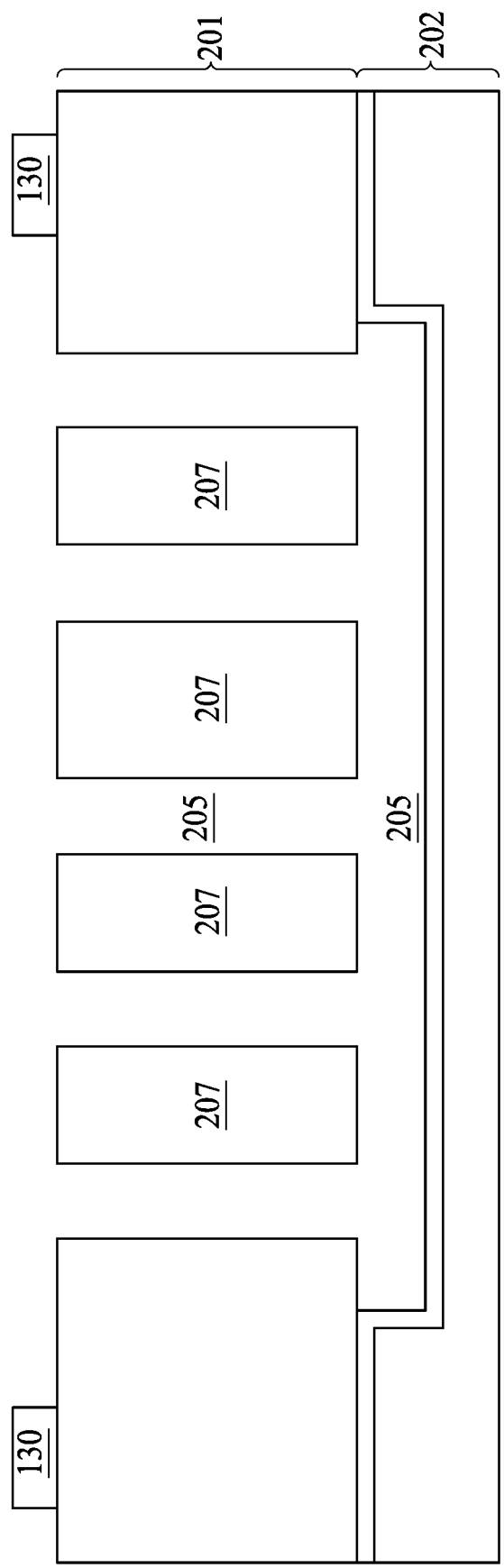

In FIG. 13, a MEMS substrate 201 and a cap substrate 202 are provided and bonded. A second metal layer 130 is formed correspondingly away from the sensing workpiece 207 and over the surface opposite to the cap substrate 202. In some embodiments, the second metal layer 13 is a metal capable of forming an eutectic bond with Al. For example, the second metal layer 130 includes Ge. In some embodiments, the patterning and etching techniques used to form the MEMS substrate 201 may vary depending on the type of the MEMS device. For example, the patterning and etching for a MEMS accelerometer is different from the patterning and etching used for a MEMS gyroscope. Existing etching techniques like anisotropic etching, RIE, or the like may be used. In some embodiments, the thickness of the MEMS substrate 201 can vary as a function of position along the length of the sensing substrate, where the length is defined along a direction orthogonal to the thickness of the substrate. For example, the MEMS substrate 201 may have a first thickness at one end, a second thickness in the center, and a third thickness at the other end. The MEMS substrate 201 is then thinned using a grinding and/or other thinning process to achieve the desired thickness. Existing thinning techniques like Chemical Mechanical Planarization (CMP) and/or Reactive Ion Etching (RIE) can be used to achieve the desired thickness. Suitable grinding and polishing equipments may be used for the thinning process. One of ordinary skill in the art would recognize many variations, modifications, and alternatives.

Figure 14:
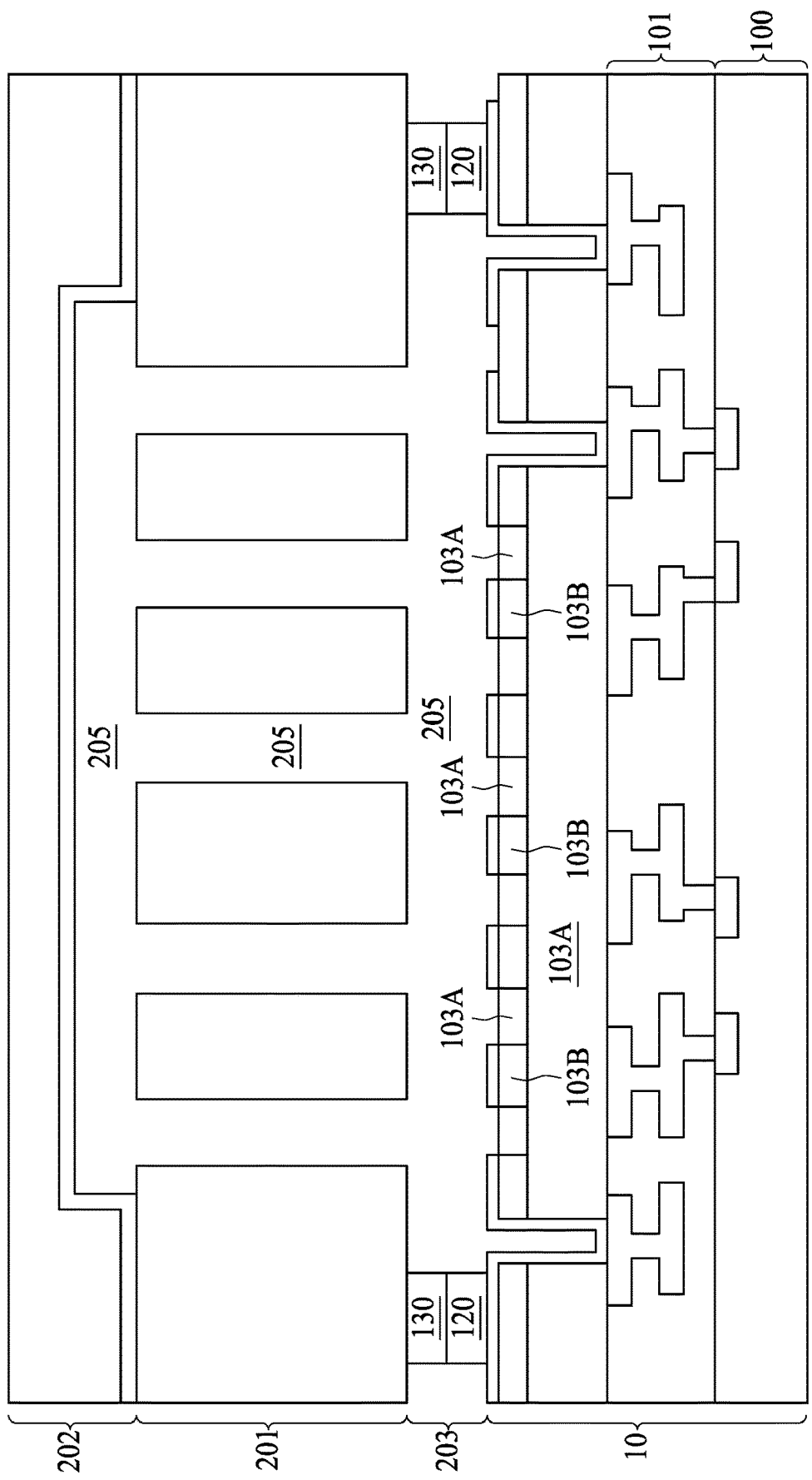

In FIG. 14, the MEMS substrate 201 and the CMOS structure 10 are bonded through eutectic bond 203. Bonding areas of the CMOS structure 10 is brought in contact with the bonding regions of the MEMS substrate 201. The bonding interface is then subjected to pressure and heat in order to reflow the conductive material comprised in the bonding regions of the MEMS substrate 201 and the corresponding bonding areas of the CMOS structure 10. Reflow of the conductive material results in a fused bond structure that provides an ohmic contact between the MEMS substrate 201 and the CMOS structure 10. The bond between the MEMS substrate 201 and the CMOS structure 10 can be an Al/Ge eutectic bond. This eliminates the need for providing a separate electrical path for the signals between the sensing substrate and the CMOS structure 10. Please note that this is not a limitation of the present disclosure. In some embodiments, the eutectic bond may be comprised of other type of metallic materials. Eutectic reactions are a triple point in the phase diagram where solid alloys mixtures transform directly to a liquid phase. Upon cooling, a microstructure is formed, which is both strong and hermetic. Eutectic metal compositions have several benefits as sealing materials, including the ability to accurately deposit and define the metals in desired patterns, the tolerance to surface deviations, roughness and particulates, plus metals' inherent hermeticity and conductivity. Hermeticity, the degree of air tightness for a vessel or package, is useful for MEMS packages because the mechanical and electrical functionality of the device within the package typically relies on critical environmental control. Change in the atmosphere inside the package can bring about a shift in performance or even a total failure of the device.

After the formation of the eutectic bond 203, a vacuum region 205 of the CMOS-MEMS structure 20 is defined. The vacuum pressure of the vacuum region 205 depends on the amount of outgassing from the exposed outgassing layer 103A. In some embodiments, the CMOS-MEMS structure 20 is designed for a low vacuum pressure MEMS device such as an accelerometer, therefore, a portion of the outgassing layer 103A is exposed to the vacuum region 205.

Figure 15:
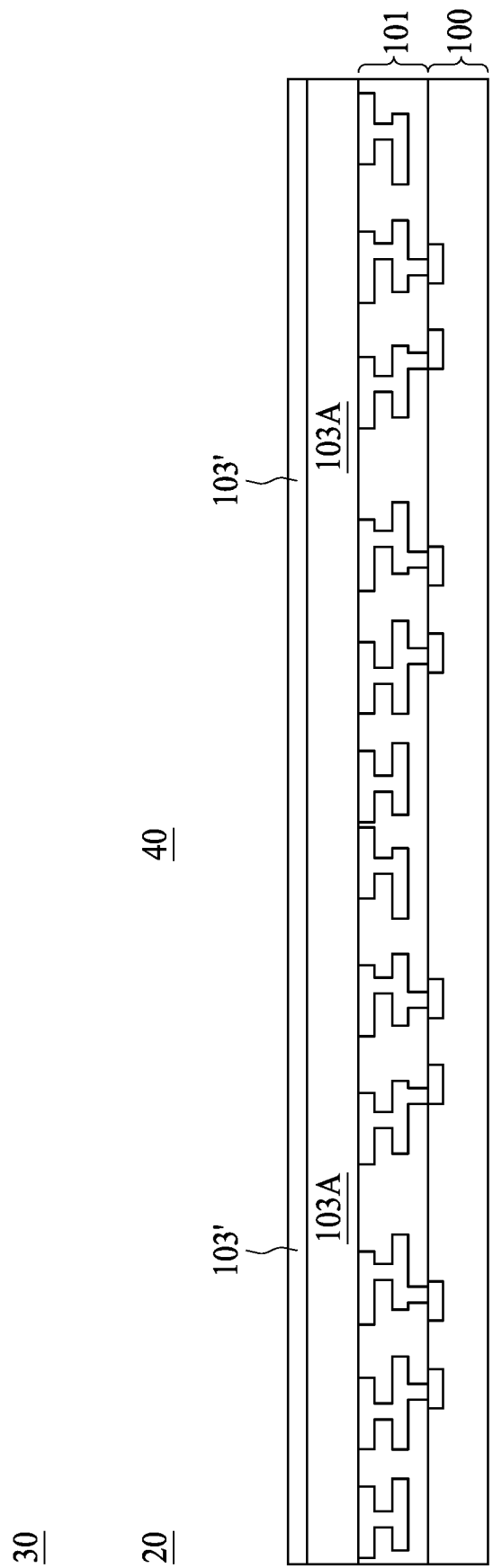
FIG. 15 to FIG. 21 are fragmentary cross sections of operations for a CMOS-MEMS structure, in accordance with some embodiments of the present disclosure.
Figure 16:
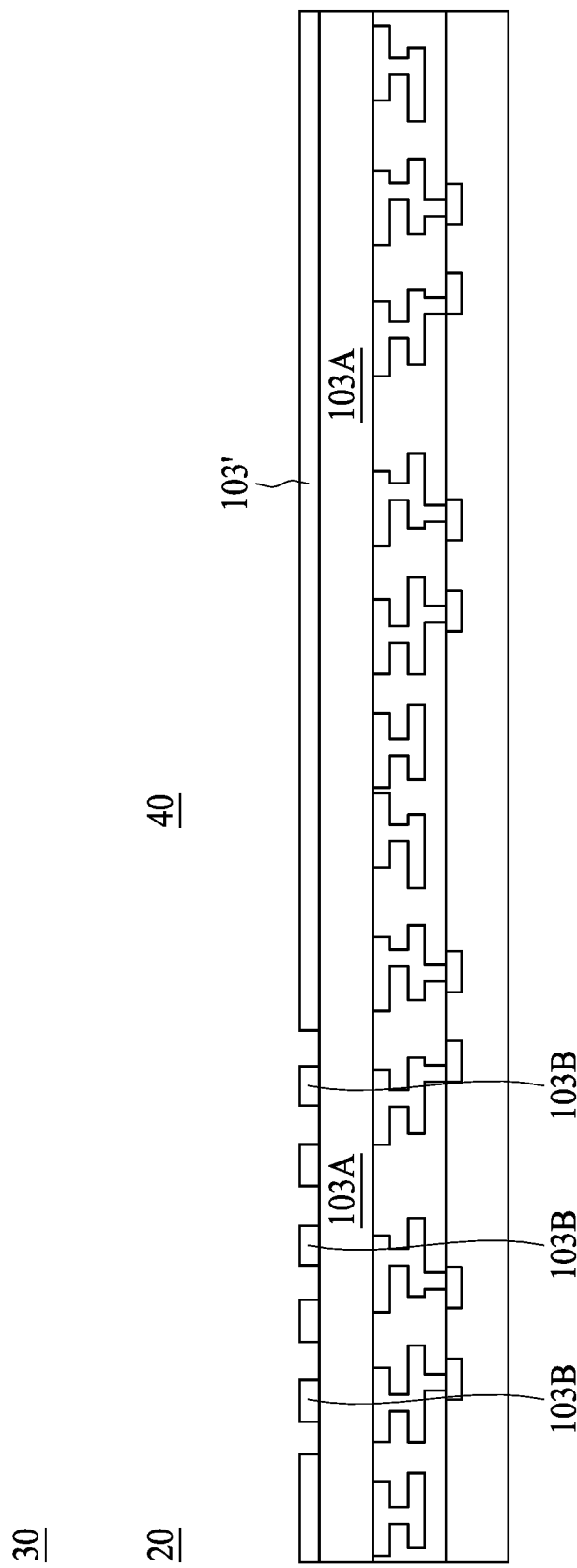
Figure 17:
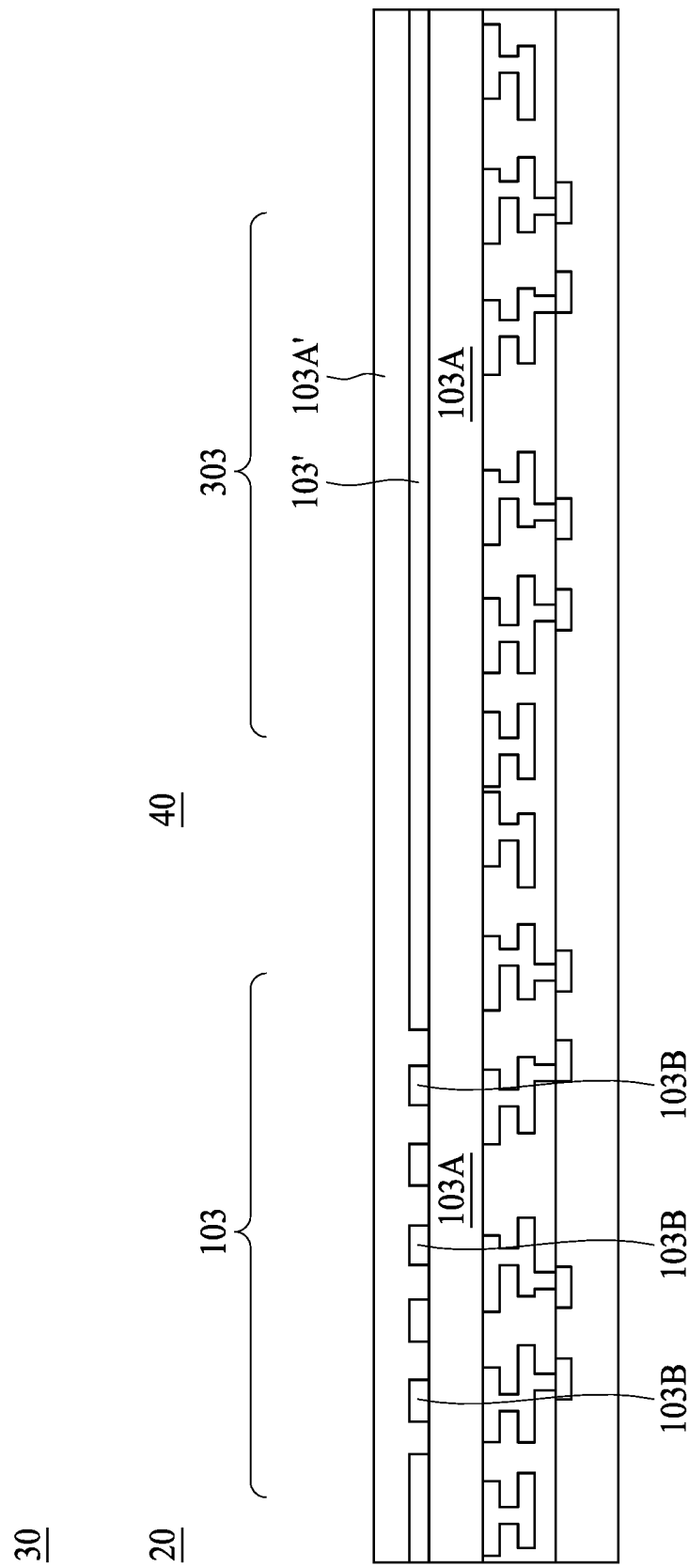
Figure 18:
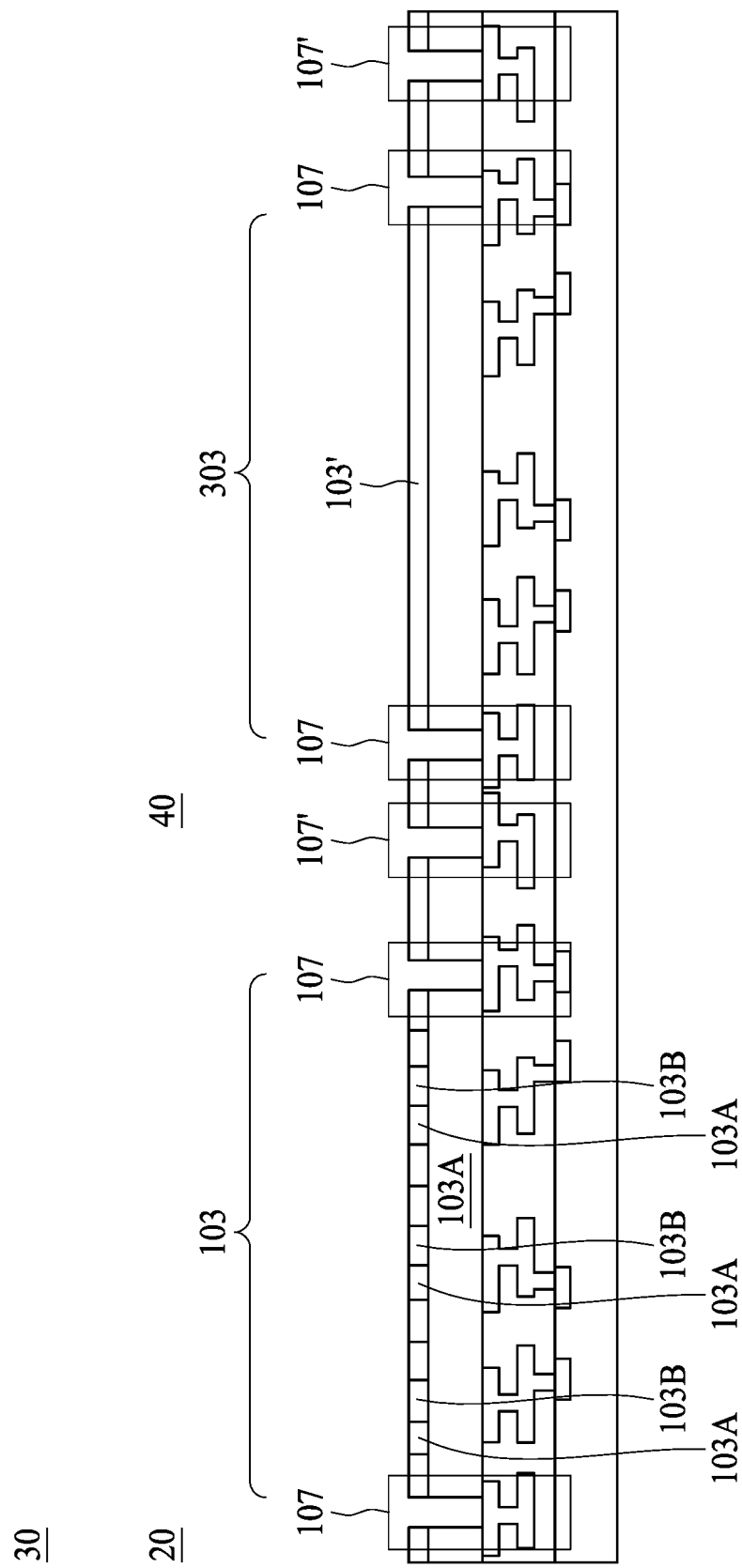

FIG. 15 to FIG. 21 are fragmentary cross sections of operations for a CMOS-MEMS structure 30, in accordance with some embodiments of the present disclosure. The CMOS-MEMS structure 30 is integrated by a CMOS-MEMS structure 20 and a CMOS-MEMS structure 40. Discussion regarding the formation of the CMOS-MEMS structure 20 can be referred to FIG. 6 to FIG. 14. Only the formation of CMOS-MEMS structure 40 would be discussed in the following. In FIG. 15, an outgassing barrier 103' is blanket deposited over the first outgassing layer 103A of the CMOS-MEMS structure 40. In FIG. 16, the outgassing barrier 103' is patterned by a first mask in a lithography operation to form patterned outgassing barrier 103B in the CMOS-MEMS structure 20 whereas remaining an overall coverage in the CMOS-MEMS structure 40. In FIG. 17, a second outgassing layer 103A' is formed over the outgassing barrier 103' in the sensing structure 303 of the CMOS-MEMS structure 40. In some embodiments, the first outgassing layer 103A and the second outgassing layer 103A' are formed of high density plasma oxides. A planarization operation of the second outgassing layer 103A' is performed as depicted in FIG. 18. A portion of the second outgassing layer 103A' is removed until a top surface of the outgassing barrier 103' is exposed. In addition, trenches 107, 107' are formed in a signal transmitting region surrounding the sensing structure 103, 303 of the CMOS structure. Note the outgassing barrier 103B is completely covering the first outgassing layer 103A in CMOS-MEMS structure 40.

Figure 19:
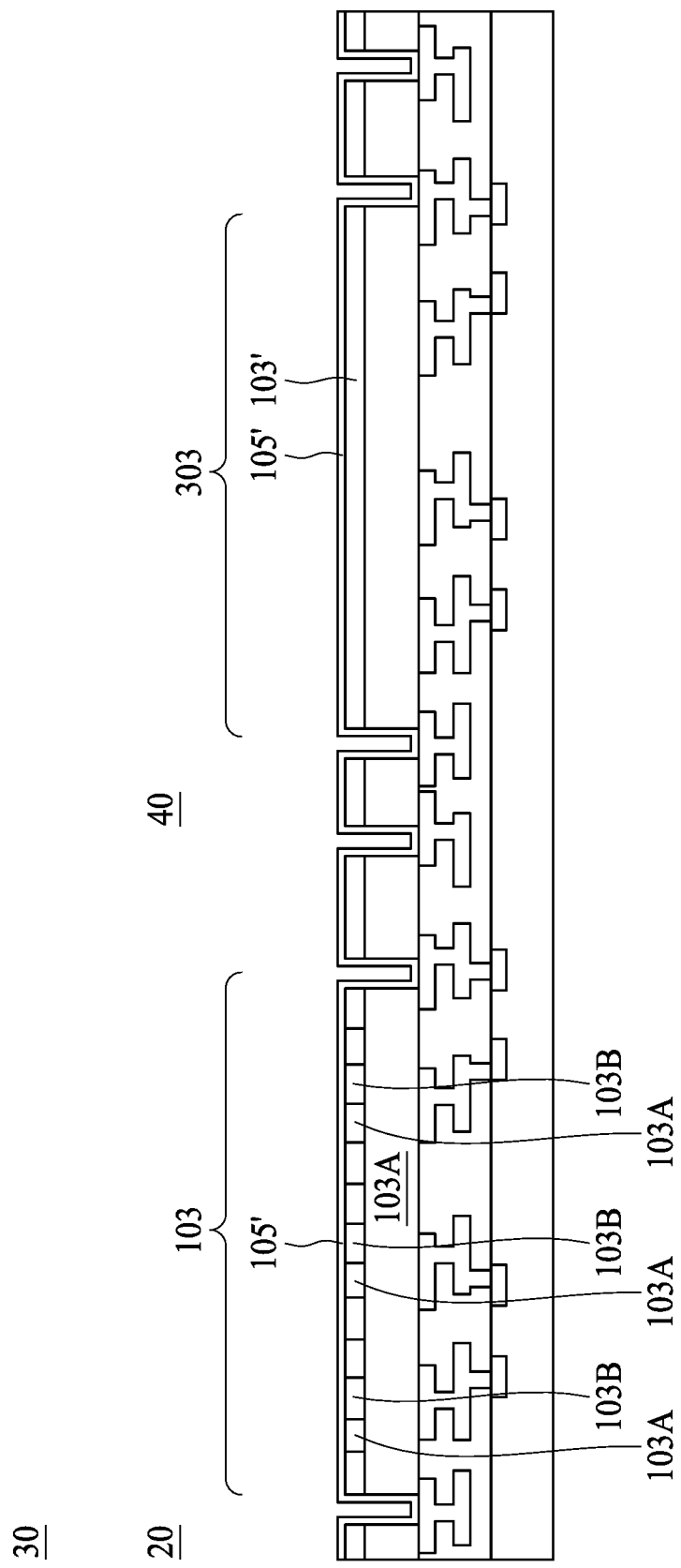
Figure 20:
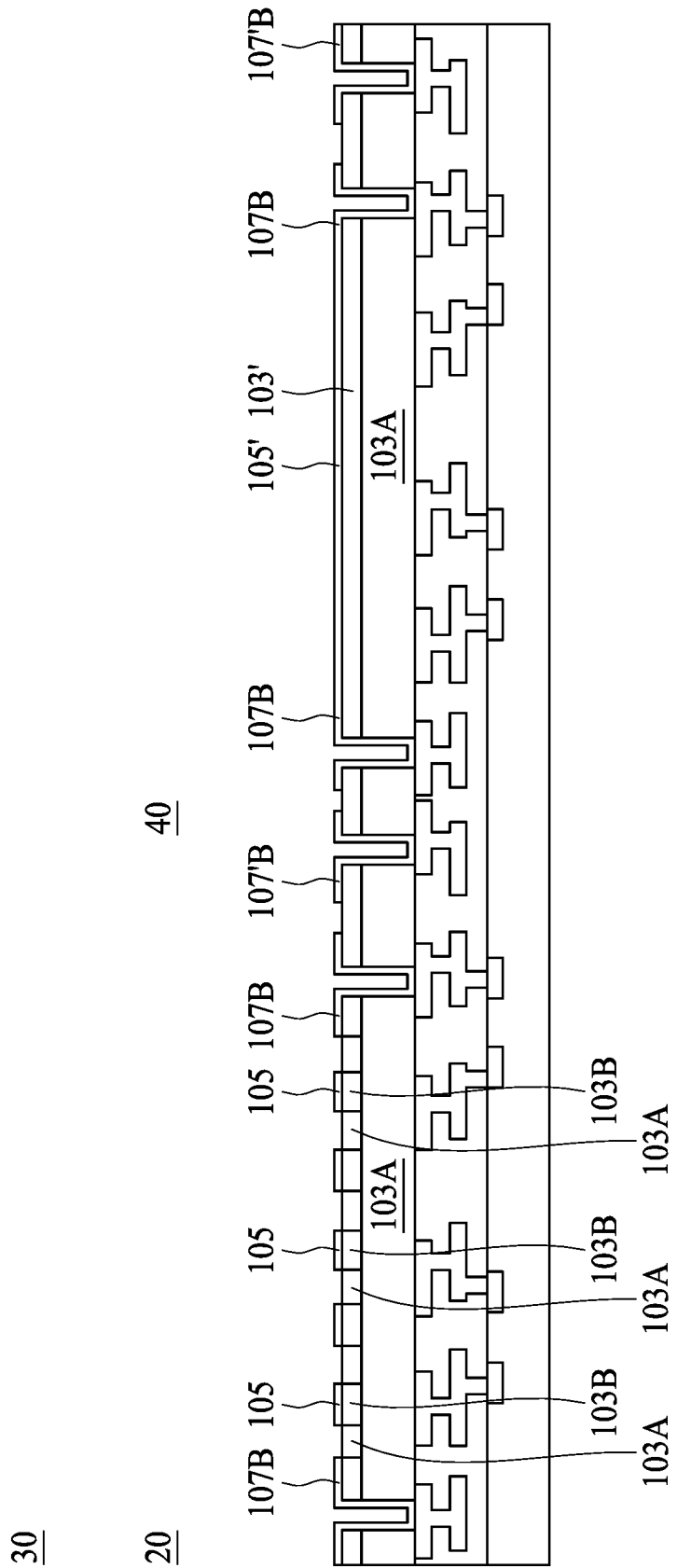
Figure 21:
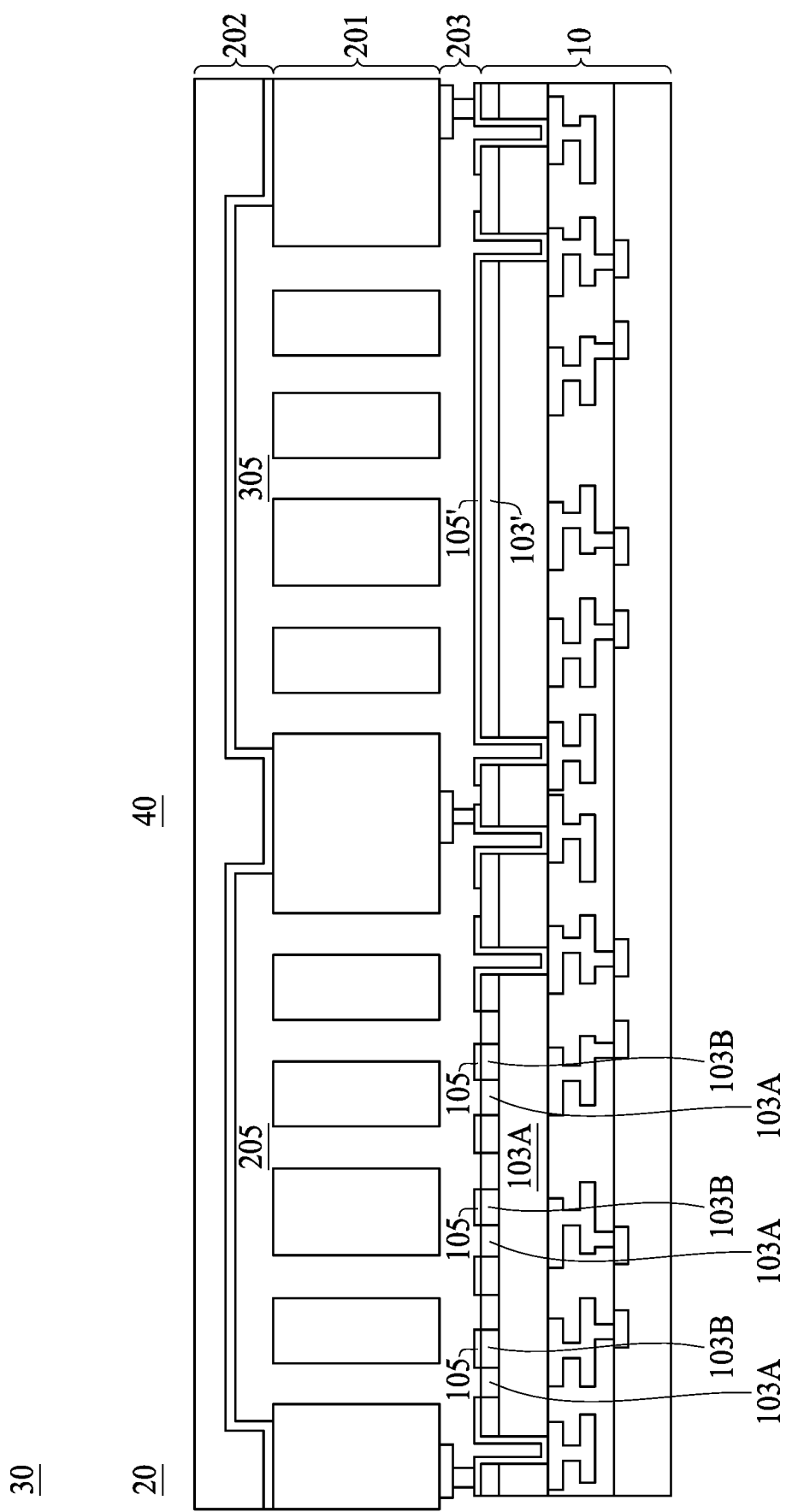

In FIG. 19, a conductive layer 105' is deposited over the sensing structure 103, 303 and the signal transmitting regions 107, 107'. In FIG. 20, a second lithography operation is performed using a second mask to pattern the conductive layer 105' in the CMOS-MEMS structure 20 whereas the conductive layer 105' is completely covering the first outgassing layer 103A. In FIG. 21, a MEMS substrate 201 and the cap substrate 202 are pre-combined and then bonding to the CMOS structure 10 through, for example, an eutectic bond 203. Note in FIG. 21, the first outgassing layer 103A of the CMOS-MEMS structure 40 is not exposed to the vacuum region 305 defined by the MEMS substrate 201, the cap substrate 202, and the CMOS structure 10, therefore, the vacuum pressure in the CMOS-MEMS structure 40 is comparatively lower than the vacuum pressure of the vacuum region 205 in the CMOS-MEMS structure 20. In some embodiments, the CMOS-MEMS structure 40 includes a gyroscope as the sensing workpiece in the MEMS substrate 201.

Some embodiments of the present disclosure provide a CMOS structure, including a substrate, a metallization layer over the substrate, a sensing structure over the metallization layer, and a signal transmitting structure adjacent to the sensing structure. The sensing structure includes an outgassing layer over the metallization layer, a patterned outgassing barrier over the outgassing layer; and an electrode over the patterned outgassing barrier. The signal transmitting structure electrically coupling the electrode and the metallization layer.

Some embodiments of the present disclosure provide a CMOS-MEMS structure, including a MEMS having a first sensing workpiece, and a CMOS having a first sensing structure corresponding to the first sensing workpiece. The first sensing structure includes a first outgassing layer, a first patterned outgassing barrier over the first outgassing layer, and a first electrode over the first patterned outgassing barrier.

Some embodiments of the present disclosure provide a method for manufacturing a CMOS structure. The method includes (1) providing a substrate, (2) forming a metallization layer over the substrate, (3) forming a first outgassing layer over the metallization layer, (4) patterning an outgassing barrier over the first outgassing layer in a sensing structure of the CMOS structure by a first mask, and (5) forming an electrode over the outgassing barrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a MEMS having a first sensing workpiece;
   a CMOS having a first sensing structure corresponding to the first sensing workpiece, the first sensing structure comprising:
      a first outgassing layer;
      a first patterned outgassing barrier over the first outgassing layer; and
      a first sensing electrode over the first patterned outgassing barrier and exposing the first outgassing layer.

2. The semiconductor device of claim 1, further comprising:
   a second sensing workpiece in the MEMS;

a second sensing structure in the CMOS, corresponding to the second sensing workpiece, the second sensing structure comprises:
- a second outgassing layer;
- a second outgassing barrier completely cover the second outgassing layer; and
- a second electrode over the second outgassing barrier.

3. The semiconductor device of claim 1, wherein the first patterned outgassing barrier comprises a mesh pattern evenly distributed under the first sensing workpiece.

4. The semiconductor device of claim 1, wherein the first sensing structure and the first sensing workpiece form an accelerometer.

5. The semiconductor device of claim 2, wherein the second sensing structure and the second sensing workpiece form a gyroscope.

6. The semiconductor device of claim 1, wherein the first outgassing layer comprises oxides.

7. The semiconductor device of claim 1, wherein the first sensing workpiece and the CMOS are electrically connected through an eutectic bonding outside of the first sensing structure, the eutectic bonding being positioned on a layer having a same level with the first patterned outgassing barrier.

8. The semiconductor device of claim 1, wherein the first outgassing barrier comprises nitrides or oxynitrides.

9. A semiconductor device, comprising:
- a CMOS-MEMS structure having a first portion and a second portion, the CMOS-MEMS structure comprising:
  - a first outgassing layer;
  - an outgassing barrier over the first outgassing layer;
  - a plurality of electrodes over the outgassing barrier; and
  - a MEMS structure connected to the electrodes;
- wherein the outgassing barrier is patterned only at the first portion of the CMOS-MEMS structure.

10. The semiconductor device of claim 9, further comprising a second outgassing layer over the first outgas sing layer.

11. The semiconductor device of claim 10, wherein the second outgassing layer fills a plurality of spaces at the outgassing barrier.

12. The semiconductor device of claim 10, wherein a top surface of the second outgas sing layer is coplanar with the outgas sing barrier.

13. The semiconductor device of claim 9, further comprising:
- a metallization layer below the first outgas sing layer; and
- a substrate below the metallization layer.

14. The semiconductor device of claim 13, further comprising a plurality of trenches in the outgassing barrier and the first outgassing layer away from the first portion and the second portion of the CMOS-MEMS structure.

15. The semiconductor device of claim 14, wherein the electrodes are extended in to the trenches and connected to the metallization layer.

* * * * *